United States Patent
Kim et al.

(10) Patent No.: US 9,306,166 B1
(45) Date of Patent: Apr. 5, 2016

(54) FABRICATION METHOD OF RESISTANCE VARIABLE MEMORY APPARATUS

(71) Applicant: SK hynix Inc., Gyeonggi-do (KR)

(72) Inventors: Jun Kwan Kim, Gyeonggi-do (KR); Young Ho Lee, Gyeonggi-do (KR); Su Jin Chae, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/683,945

(22) Filed: Apr. 10, 2015

(30) Foreign Application Priority Data

Jan. 28, 2015 (KR) .......................... 10-2015-0013407

(51) Int. Cl.
H01L 45/00 (2006.01)

(52) U.S. Cl.
CPC ............ H01L 45/1641 (2013.01); H01L 45/06 (2013.01); H01L 45/1616 (2013.01); H01L 45/1625 (2013.01); H01L 45/1666 (2013.01)

(58) Field of Classification Search
None
See application file for complete search history.

(56) References Cited

U.S. PATENT DOCUMENTS

| | | | | |
|---|---|---|---|---|
| 4,804,490 | A * | 2/1989 | Pryor | H01L 45/04 204/192.25 |
| 5,837,564 | A * | 11/1998 | Sandhu | H01L 21/2022 257/E21.133 |
| 8,039,297 | B2 * | 10/2011 | Kim | H01L 45/1641 438/102 |
| 2005/0270821 | A1 * | 12/2005 | Nakano | H01L 45/1625 365/145 |
| 2012/0307552 | A1 * | 12/2012 | Perniola | H01L 45/1625 365/163 |
| 2014/0264230 | A1 * | 9/2014 | Borodulin | H01L 45/1625 257/4 |
| 2015/0037929 | A1 * | 2/2015 | Park | H01L 45/06 438/102 |

FOREIGN PATENT DOCUMENTS

KR 1020090116344 11/2009

OTHER PUBLICATIONS

Bragaglia et al., Structural change upon annealing of amorphous GeSbTe grown on Si(111), J. Appl. Phys. 116, 054913 (2014).*

* cited by examiner

*Primary Examiner* — Andres Munoz
(74) *Attorney, Agent, or Firm* — IP & T Group LLP

(57) ABSTRACT

A fabrication method of a resistance variable memory apparatus includes forming an amorphous phase-change material layer on a semiconductor substrate in which a bottom structure is formed, and performing crystallization on the amorphous phase-change material layer through a low-temperature plasma treatment process.

26 Claims, 6 Drawing Sheets

FABRICATION METHOD OF RESISTANCE VARIABLE MEMORY APPARATUS

CROSS-REFERENCES TO RELATED APPLICATION

This application claims priority under 35 U.S.C. 119(a) to Korean application No. 10-2015-0013407, filed on Jan. 28, 2015, which is herein incorporated by reference in its entirety.

BACKGROUND

1. Technical Field

Various embodiments relate to a semiconductor memory apparatus, and more particularly, to a fabrication method of a resistance variable memory apparatus.

2. Related Art

Nonvolatile memory apparatuses may include a ferroelectric random access memory (FeRAM), a magnetic RAM (MRAM), a phase-change RAM (PRAM), a resistive RAM (ReRAM), a polymer RAM (PoRAM), and the like according to a structure of a unit memory cell or a type of data storage material.

Among the nonvolatile memory apparatuses, the resistance variable memory apparatus such as, a PRAM or ReRAM is a storage apparatus in which a data storage material layer is interposed between a pair of electrodes, and data is stored by changing a resistance state of the data storage material layer through application of a current or voltage.

The resistance variable memory apparatus is in the spotlight as a next-generation memory apparatus in which advantages such as, low cost, random access, high speed operation, low power consumption, and non-volatility are merged.

PRAMs use a phase-change material as a data storage material. When data is written in a PRAM, an access device is driven through a word line. When a current path is formed along the data storage material through a bit line, a state of the phase-change material is changed from a crystalline state (a low-resistance state) to an amorphous state (a high-resistance state) or vice versa.

Demands for high integration and miniaturization of the semiconductor memory apparatus have continued. The resistance variable memory apparatus such as, the PRAM is also required to meet such requirements. Therefore, there is a need for technology for forming a resistance variable memory apparatus with ultra-high thinning, ultra-miniaturization, high yield, and high reliability.

SUMMARY

According to an embodiment, there is provided a method of fabricating a resistance variable memory apparatus. The method may include forming an amorphous phase-change material layer on a semiconductor substrate in which a bottom structure is formed, and performing crystallization on the amorphous phase-change material layer through a low-temperature plasma treatment process.

According to an embodiment, there is provided a method of fabricating a resistance variable memory apparatus. The method may include forming an amorphous phase-change material layer on a semiconductor substrate in which a bottom structure is formed, forming a capping layer on a surface of the amorphous phase-change material layer, and performing crystallization on the amorphous phase-change material layer through a low-temperature plasma treatment process.

These and other features, aspects, and embodiments are described below in the section entitled "DETAILED DESCRIPTION".

BRIEF DESCRIPTION OF THE DRAWINGS

The above and other aspects, features and advantages of the present disclosure will be more clearly understood from the following detailed description taken in conjunction with the accompanying drawings, in which.

DETAILED DESCRIPTION

Figure 1:
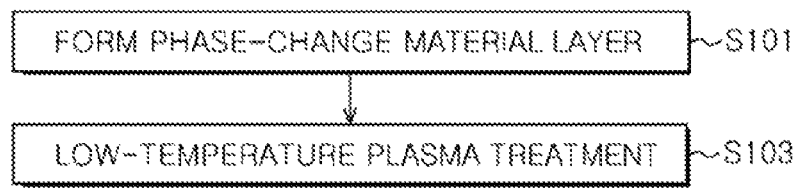
FIG. 1 is flowchart illustrating a method of fabricating a resistance variable memory apparatus according to an embodiment.

Exemplary embodiments will be described in greater detail with reference to the accompanying drawings. Exemplary embodiments are described herein with reference to cross-sectional illustrations that are schematic illustrations of exemplary embodiments and intermediate structures. As such, variations from the shapes of the illustrations as a result of, for example, manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa as long as it is not specifically mentioned.

The inventive concept is described herein with reference to cross-section and/or plan illustrations that are schematic illustrations of exemplary embodiments. However, embodiments should not be limited or construed as limited to the inventive concept. Although a few embodiments will be shown and described, it will be appreciated by those of ordinary skill in the art that changes may be made in these exemplary embodiments without departing from the principles and spirit of the inventive concept.

FIG. 1 is a flowchart illustrating a fabrication method of a resistance variable memory apparatus according to an embodiment, and the fabrication method will be described by exemplifying a PRAM.

The resistance variable memory apparatus, for example, the PRAM, uses a phase-change material as a data storage material. The phase-change material may be, for example, germanium (Ge)-antimony (Sb)-tellurium (Te) (GST).

In an embodiment, when a semiconductor substrate in which a bottom structure such as an access device or a lower electrode is formed is provided, a phase-change material layer may be formed on the semiconductor substrate (S101). The phase-change material layer may be formed in an amorphous state. In an embodiment, the phase-change material layer may be formed using deposition methods such as a physical vapor deposition (PVD) method, an atomic layer deposition (ALD) method, a chemical vapor deposition (CVD) method, or a combination thereof. A phase-change material for the phase-change material layer may be an undoped phase-change material, a nitrogen (N)-doped phase-change material, a carbon (C)-doped phase-change material, an oxygen (O)-doped phase-change material, or a combination thereof. However, the phase-change material is not limited thereto.

Since the phase-change material layer is formed in an amorphous state, crystallization of the amorphous phase-change material layer is necessary after the phase-change material layer is formed. For the crystallization, in an embodiment, a low-temperature plasma treatment process may be performed (S103).

The low-temperature plasma treatment process may be performed in a low temperature of 300° C. or less, specifically, in a range of 130 to 300° C. More specifically, the low-temperature plasma treatment process may be performed in a temperature of 130 to 260° C. An inert gas is used for the plasma treatment, and the inert gas may include helium (He), argon (Ar), or a combination gas of He and Ar.

In particular, He has a relatively small atomic size and low reactivity with other elements. When the low-temperature plasma treatment process is performed using He, the plasmarized He ions deeply penetrate into a target film, that is, the phase-change material layer, but the plasmarized He ions do not react with elements constituting the phase-change material layer. Therefore, crystallization characteristics for the phase-change material layer may improve. The plasmarized He ions have high penetration due to the small atomic size, and thus have advantages in crystallization of a large size of phase-change material.

In an embodiment, the low-temperature plasma treatment process may be a microwave plasma process or a radio frequency (RF) plasma process. When the microwave plasma process is performed, the microwave having the power in a range of 1 to 4 kW may be applied. When the RF plasma process for crystallization of the phase-change material layer having a large aspect ratio is performed, the bias power of the RF plasma may be 0.1 to 1.0 kW.

In an embodiment, during the low-temperature plasma treatment process, a flow amount of the inert gas may be in a range of 1000 to 3000 sccm, and pressure in a chamber may be in a range of 1 to 5 Torr.

When the plasma is continuously applied to the phase-change material layer, temperature of electrons in the phase-change material layer may increase, causing thermal damage to the phase-change material layer. To prevent such thermal damage, plasma is applied intermittently. For example, the plasma application time is divided into multiple short periods, and a cyclic treatment may be performed. Detailed description for the cyclic treatment will be made later.

That is, the low-temperature plasma treatment process may be performed in a continuous manner or in a cyclic manner, and a total processing time may be controlled in a range of 120 to 720 seconds.

When a high-temperature thermal process is performed for crystallization of the phase-change material layer, loss of the elements constituting the phase-changed material layer may be caused, and the composition of the phase-change material layer may be changed. Further, roughness of the phase-change material layer is deteriorated, and a poor adhesion of the phase-change material layer with an upper layer may be caused.

In contrast, in the embodiment, when the low-temperature plasma treatment process of 300° C. or less is introduced to crystallize the phase-change material layer, the phase-change material layer having good roughness may be obtained without loss or change of the elements constituting the phase-change material layer. Further, the phase-change material layer is smoothly densified while the crystallization is performed, and electric characteristics of the phase-change material layer may also be guaranteed.

The phase-change material layer may be formed in various shapes, and fabrication methods of a resistance variable memory apparatus according to embodiments will be described with reference to FIGS. 2 to 4.

Figure 2:
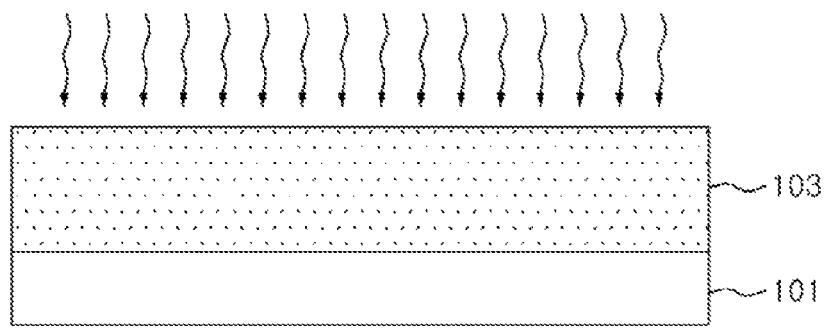
FIGS. 2 to 4 are cross-sectional views illustrating methods of fabricating a resistance variable memory apparatus according to embodiments.

FIG. 2 illustrates that a phase-change material layer 103 is formed on a semiconductor substrate 101 in a plate shape. A bottom structure such as an access device or a lower electrode may have been already formed in the semiconductor substrate 101. After the plate-shaped phase-change material layer 103 is formed in an amorphous state, crystallization of the plate-shaped amorphous phase-change material layer 103 may be performed through a low-temperature plasma treatment process. The condition of the low-temperature plasma treatment process may be similar to the above-described condition.

Figure 3:
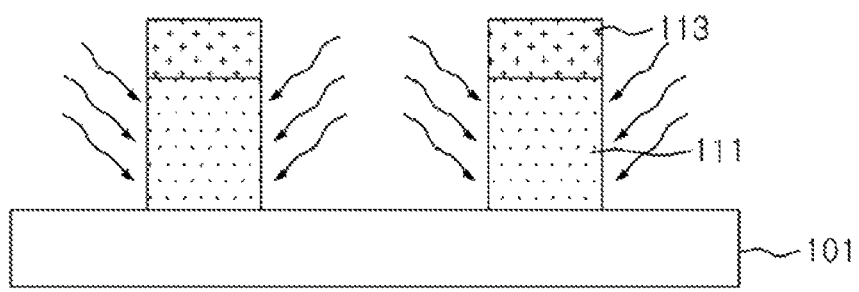

FIG. 3 illustrates that a patterned phase-change material layer 111 is formed on a semiconductor substrate 101 in which a bottom structure is formed. That is, FIG. 3 illustrates that an amorphous phase-change material layer 111 and a conductive layer, for example, an upper electrode 113 are formed on the semiconductor substrate 101, and then patterned. Even after the patterned amorphous phase-change material layer 111 is formed, crystallization of the patterned amorphous phase-change material layer 111 may be performed through the low-temperature plasma treatment process under the process condition similar to the above-described process condition.

Figure 4:
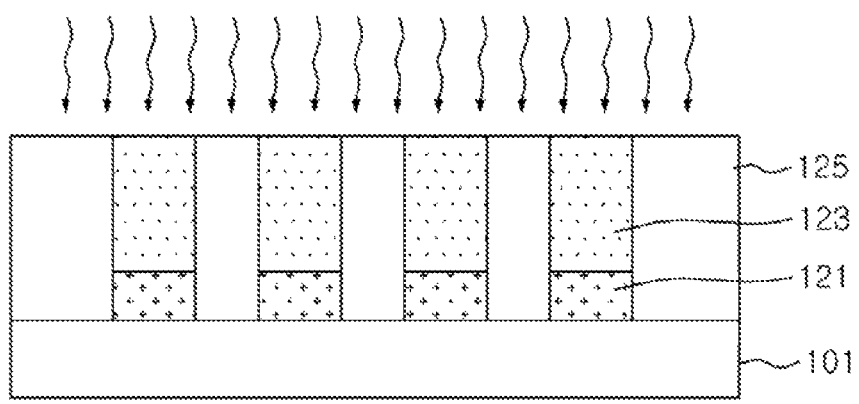

FIG. 4 illustrates a structure where a fine hole is formed in an interlayer insulating layer 125, a phase-change material layer is formed in the fine hole, and then crystallization of the phase-change material layer is performed.

Referring to FIG. 4, the interlayer insulating layer 125 is formed on a semiconductor substrate 101 in which a bottom structure is formed, and then patterned to form a hole. For example, a conductive layer 121 may be formed in a bottom portion of the hole which is formed by patterning the interlayer insulating layer 125. However, the location and the shape of the conductive layer 121 is not limited to the structure shown in FIG. 4. The hole may be buried with a phase-change material layer 123. More specifically, the amorphous phase-change material layer 123 may fill in an upper portion of the hole. The hole may have a very fine diameter or size to meet a required degree of miniaturization and integration of the PRAM, and thus the burying of the amorphous phase-change material may be advantageous in terms of a process.

Because, the amorphous phase-change material has excellent gap filling properties than the crystalline phase-change material.

After the phase-change material layer 123 fills in the hole, a low-temperature plasma treatment process is performed against the amorphous phase-change material layer 123, and the amorphous phase-change material layer 123 is crystallized.

As illustrated in FIGS. 2 to 4, the amorphous phase-change material layer may be formed in various shapes, and then crystallized through the subsequent low-temperature plasma treatment process.

Figure 5:
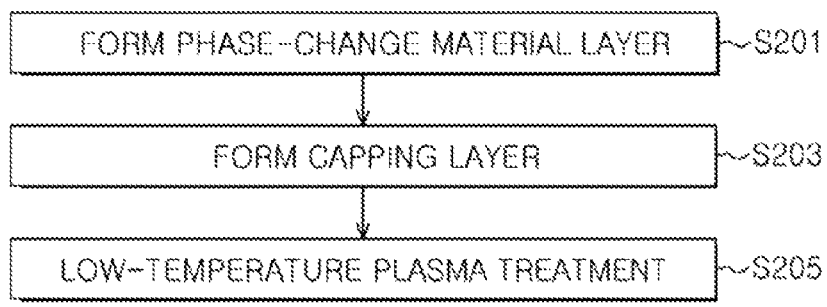
FIG. 5 is a flowchart illustrating a method of fabricating a resistance variable memory apparatus according to another embodiment.

FIG. 5 is a flowchart illustrating a fabrication method of a resistance variable memory apparatus according to another embodiment.

In an embodiment, a phase-change material layer, for example, an amorphous phase-change material layer, may be formed on a semiconductor substrate in which a bottom structure is formed (S201). Then, a capping layer for protecting the phase-change material layer may be formed (S203). A low-temperature plasma treatment process may be formed to crystallize the amorphous phase-change material layer (S205).

In an embodiment, the capping layer may have a thickness of to 100 Å. The capping layer may include silicon nitride, silicon oxide, silicon oxide nitride, or a combination thereof.

In an embodiment, the phase-change material layer may be formed using various deposition methods such as physical vapor deposition (PVD), atomic layer deposition (ALD) and chemical vapor deposition (CVD). A phase-change material for the phase-change material layer may include an undoped phase-change material, an N-doped phase-change material, a C-doped phase-change material, an O-doped phase-change material, or a combination thereof.

The low-temperature plasma treatment process may be performed in a low temperature of 300° C. or less, specifically, in a range of 130 to 300° C. More specifically, the low-temperature plasma treatment process may be performed in a temperature range of 130 to 260° C. An inert gas is used for the plasma treatment, and the inert gas may include He, Ar, or a combination gas of He and Ar.

In particular, He has a relatively small atomic size and low reactivity with other elements. Even when the capping layer is formed on the surface of the phase-change material layer, the plasmarized He ions may deeply penetrate into the phase-change material layer through the capping layer, and the crystallization of the phase-change material layer may be induced. The phase-change material layer as well as the capping layer may be densified, and thus the capping characteristic may be further improved.

In an embodiment, the low-temperature plasma treatment process may be a microwave plasma process or a radio frequency (RF) plasma process. When the microwave plasma process is performed, the microwave having the power in a range of 1 to 4 kW may be applied. When the RF plasma process is performed, the bias of RF may be in a range of 0.1 to 1.0 kW.

In an embodiment, during the low-temperature plasma treatment process, a flow amount of the inert gas may be in a range of 1000 to 3000 sccm, and pressure in a chamber may be in a range of 1 to 5 Torr.

The low-temperature plasma treatment process may be performed in a continuous manner or in a cyclic manner, and a total processing time may be controlled in a range of 120 to 720 seconds.

The phase-change material layer may be formed in various shapes, and methods of forming the phase-change material layer will be described with reference to FIGS. 6 and 7.

Figure 6:
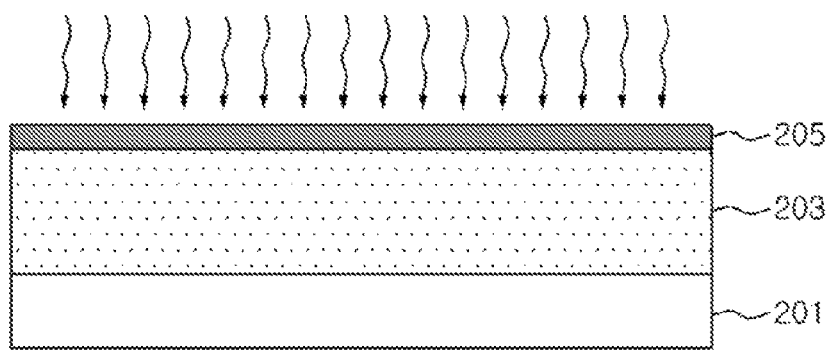
FIGS. 6 and 7 are cross-sectional views illustrating methods of fabricating a resistance variable memory apparatus according to embodiments.

FIG. 6 illustrates that a phase-change material layer 203 is formed on a semiconductor substrate 201 in a plate shape. A bottom structure such as an access device or a lower electrode may have been already formed in the semiconductor substrate 201. After the plate-shaped phase-change material layer 203 in an amorphous state is formed, a capping layer 205 may be formed on the phase-change material layer 203.

Subsequently, a low-temperature plasma treatment process may be performed, and the condition of the low-temperature plasma treatment process may be similar to the above-described condition.

The densification and the crystallization of the phase-change material layer 203 may be obtained through the low-temperature plasma treatment process. The capping layer 205 may also be densified, and the PRAM having good electric characteristics may be fabricated.

Figure 7:
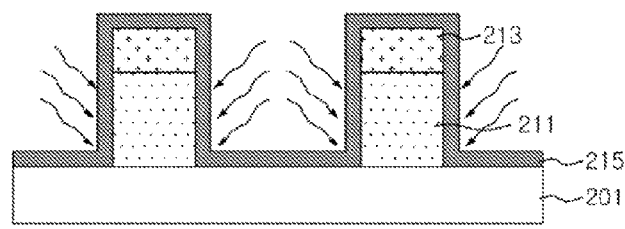

FIG. 7 illustrates that a patterned phase-change material layer 211 is formed on a semiconductor substrate 201 in which a bottom structure is formed. Specifically, an amorphous phase-change material layer 211 and a conductive layer, for example, an upper electrode 213, are formed on the semiconductor substrate 201 and then patterned. A capping layer 215 is formed on the semiconductor substrate in which the amorphous phase-change material layer 211 and the upper electrode 213 are patterned.

Even though a surface of the patterned phase-change material layer 211 is protected by the capping layer 215, the patterned phase-change material layer 211 may be crystallized by a low-temperature plasma treatment process which is performed under the condition similar to the above-described condition.

Figure 8:
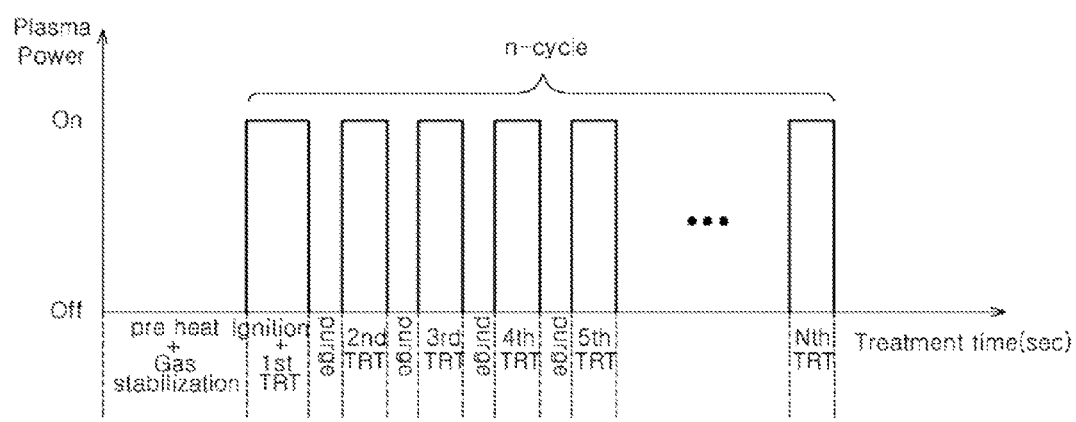
FIG. 8 is a view describing a low-temperature plasma treatment process according to an embodiment.

FIG. 8 is a view describing a low-temperature plasma treatment process according to an embodiment.

The low-temperature plasma treatment process may be performed in an n-cyclic treatment process in such a manner that a treatment operation and a purge operation are repeatedly performed a preset number of times (for example, n times wherein n is an integer).

Before the substantial process is performed, a pretreatment process in which a process chamber is preheated to a preset temperature is performed. A source gas such as an inert gas is stabilized during the pretreatment process.

Then, the treatment and purge operations may be alternately repeated n times, and a total process time may be controlled in a range of 120 to 720 seconds.

In particular, a first cycle of treatment operation includes an ignition process.

As described above, when the plasma is continuously applied to the phase-change material layer, a temperature of electrons in the phase-change material layer may increase. Since the plasma application time is divided into short periods and the treatment and purge operations are alternately repeatedly performed in the cyclic treatment process, thermal damage to the phase-change material layer may be prevented.

The repeated number of times of the treatment and purge operations may be, for example, 10 to 30, but the repeated number is not limited thereto.

In the embodiment, after the amorphous phase-change material layer is formed, the crystallization of the amorphous phase-change material layer is performed through the low-temperature plasma treatment process. The supplied reaction gas may include He, Ar, or a combination gas of He and Ar as described above. The plasma ions have a function to induce the crystallization of the amorphous phase-change material layer and to remove impurities, and the function of the plasma ions will be described with reference to FIG. 9.

Figure 9A:
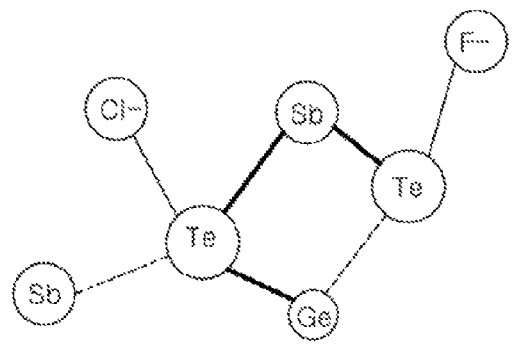
FIGS. 9A to 9C are views describing a crystallization principle through a low-temperature plasma treatment process according to an embodiment.
Figure 9B:
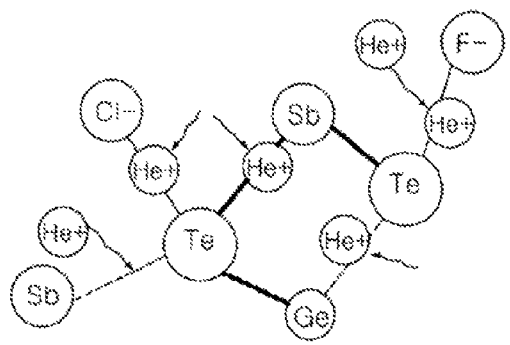
Figure 9C:
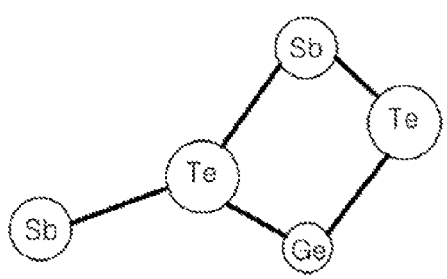

FIGS. 9A to 9C are views explaining a crystallization principle through a low-temperature plasma treatment process according to an embodiment.

As illustrated in FIG. 9A, impurities such as Cl⁻ or F⁻ in addition to the elements Ge, Sb, and Te constituting the phase-change material may be contained in the amorphous phase-change material layer. The elements constituting the phase-change material layer may be strongly bonded with each other (strong bond) as indicated by a bold solid line or may be weakly bonded with each other (weak bond) as indicated by a dotted line.

The low-temperature plasma treatment process is performed against the amorphous phase-change material layer having both of the strong and weak bonds. The plasma He ion has a bonding energy larger than either a bonding energy between the elements constituting the phase-change material or a bonding energy between the elements constituting the phase-change material and the impurities.

As illustrated in FIG. 9B, the weak bond between the elements constituting the phase-change material is broken by the plasma reaction ion for example, He. The bonding between the elements constituting the phase-change material and the impurities may be also broken, and the impurities may be expelled out.

As illustrated in FIG. 9C, the elements which constitute the phase-change material and have the weak bond may form a strong bond. The elements which constitutes the phase-change material and had originally the strong bond may recover the strong bond by removing the plasma reaction ion. Thus, upon completion of the 3 low-temperature plasma treatment process, the impurities may be removed and the elements constituting the phase-change material may be crystallized by increased strong bond (as indicated by a bold solid line) between the elements which constitutes the phase-change material and reduced weak bond and impurities.

Figure 10:
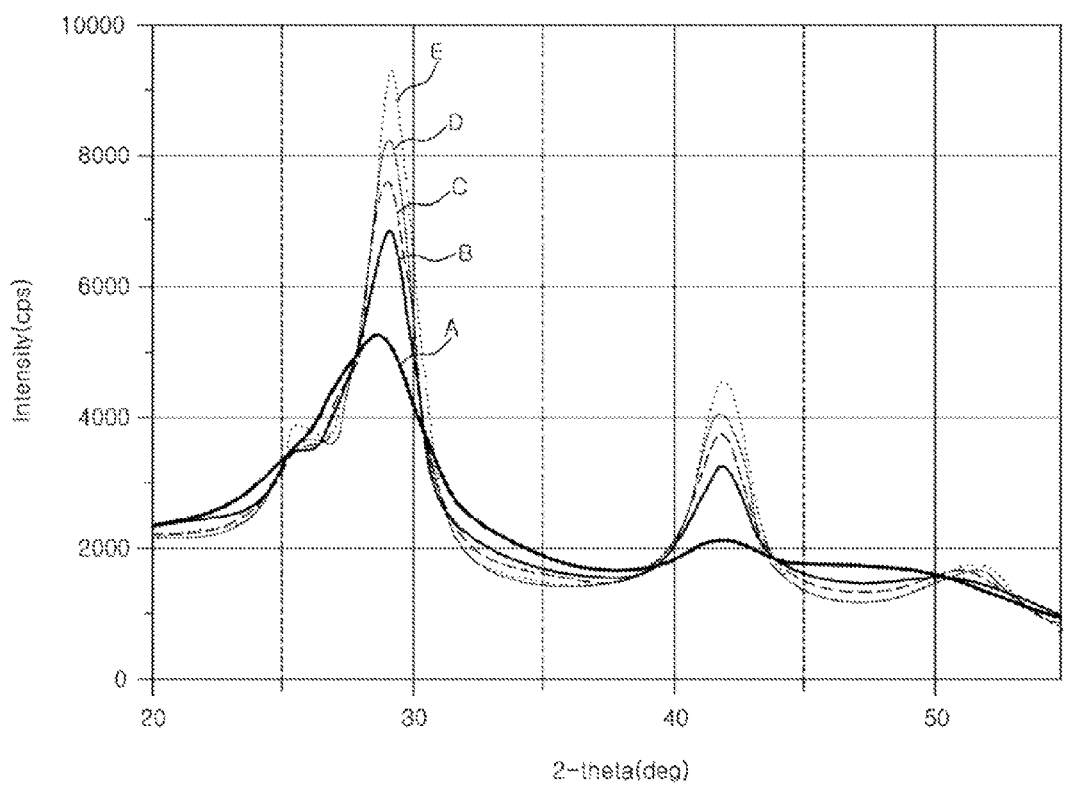
FIG. 10 is a view describing crystallization characteristics according to fabrication methods of a resistance variable memory apparatus.

FIG. 10 is a view describing crystallization characteristics according to the fabrication methods of a resistance variable memory apparatus.

FIG. 10 illustrates crystallization degrees according to a temperature condition in a plasma treatment process measured through an X-ray diffusion (XRD) method.

In FIG. 10, A indicates a crystallization characteristic of an amorphous phase-change material, B indicates a crystallization characteristic of a phase-change material when the plasma treatment process is performed in a temperature of 200° C., C indicates a crystallization characteristic of the phase-change material when the plasma treatment process is performed in a temperature of 220° C., D indicates a crystallization characteristic of the phase-change material when the plasma treatment process is performed in a temperature of 240° C., and E indicates a crystallization characteristic of a phase-change material when the plasma treatment process is performed in a temperature of 260° C.

It is apparent that excellent crystallization characteristics are obtained when the low-temperature plasma treatment process is performed in a temperature of 260° C. (E in FIG. 10).

What is claimed is:

1. A method of fabricating a resistance variable memory apparatus, the method comprising:
   forming an amorphous phase-change material layer over a semiconductor substrate; and
   performing a crystallization of the amorphous phase-change material layer through a low-temperature plasma treatment process,
   wherein the low-temperature plasma treatment process is performed in a temperature of 130 to 300° C.

2. The method of claim 1, wherein the forming of the amorphous phase-change material layer includes forming the amorphous phase-change material layer using a physical vapor deposition (PVD) method, an atomic layer deposition (ALD) method, a chemical vapor deposition (CVD) method, or a combination thereof.

3. The method of claim 1, wherein the amorphous phase-change material layer a nitrogen includes an undoped phase-change material, a nitrogen (N)-doped phase-change material, a carbon (C)-doped phase-change material, an oxygen (O)-doped phase-change material, or a combination thereof.

4. The method of claim 1, wherein the low-temperature plasma treatment process is performed using a reaction gas selected from the group consisting of helium (He), argon (Ar), and a combination thereof.

5. The method of claim 1, wherein a flow amount of a reaction gas supplied in the low-temperature plasma treatment process is 1000 to 3000 sccm.

6. The method of claim 1, wherein the low-temperature plasma treatment process is performed using a microwave power.

7. The method of claim 6, wherein the microwave power of 1 to 4 kW is applied.

8. The method of claim 1, wherein the low-temperature plasma treatment process is performed using a radio frequency (RF) power.

9. The method of claim 8, wherein the RF power of 0.1 to 1.0 kW is applied.

10. The method of claim 1, wherein the low-temperature plasma treatment process is performed in a chamber, and
    wherein a pressure of the chamber is 1 to 5 Torr.

11. The method of claim 1, wherein the low-temperature plasma treatment process is performed by repeatedly performing a plasma treatment operation and a purge operation a preset number of times.

12. The method of claim 11, wherein the preset number of times is 10 to 30 times.

13. The method of claim 1, wherein the low-temperature plasma treatment process is performed for 120 to 720 seconds.

14. The method of claim 1, wherein the forming of the amorphous phase-change material layer includes:
    providing the semiconductor substrate; and
    forming the amorphous phase-change material layer in a plate shape over the semiconductor substrate.

15. The method of claim 1, wherein the forming of the amorphous phase-change material layer includes:
    providing the semiconductor substrate;
    forming the amorphous phase-change material layer over the semiconductor substrate;
    forming a conductive layer over the amorphous phase-change material layer; and
    patterning the amorphous phase-change material layer and the conductive layer.

16. The method of claim 1, wherein the forming of the amorphous phase-change material layer includes:
    providing the semiconductor substrate;
    forming an interlayer insulating layer over the semiconductor substrate, and forming a hole by patterning the interlayer insulating layer;
    forming a conductive layer in a lower portion of the hole; and
    burying the amorphous phase-change material layer in an upper portion of the hole.

17. The method of claim 1, wherein the forming of the amorphous phase-change material layer includes:
    providing the semiconductor substrate;

forming the amorphous phase-change material layer in a plate shape over the semiconductor substrate; and forming a capping layer over the amorphous phase-change material layer.

18. The method of claim 1, wherein the forming of the amorphous phase-change material layer includes:

providing the semiconductor substrate;

forming the amorphous phase-change material layer over the semiconductor substrate;

forming a conductive layer over the amorphous phase-change material layer;

forming a patterned structure by patterning the conductive layer and the amorphous phase-change material layer; and forming a capping layer over a surface of the patterned structure.

19. A method of fabricating a resistance variable memory apparatus, the method comprising:

forming an amorphous phase-change material layer over a semiconductor substrate;

forming a capping layer over a surface of the amorphous phase-change material layer; and performing a crystallization of the amorphous phase-change material layer through a low-temperature plasma treatment process, wherein the low-temperature plasma treatment process is performed in a temperature of 130 to 300° C.

20. The method of claim 19, wherein the forming of the amorphous phase-change material layer includes forming the amorphous phase-change material layer using a physical vapor deposition (PVD) method, an atomic layer deposition (ALD) method, a chemical vapor deposition (CVD) method, or a combination thereof.

21. The method of claim 19, wherein the low-temperature plasma treatment process is performed using a reaction gas selected from the group consisting of helium (He), argon (Ar), and a combination gas thereof.

22. The method of claim 19, wherein the low-temperature plasma treatment process is a plasma treatment process using a microwave power.

23. The method of claim 22, wherein the microwave power of 1 to 4 kW is applied.

24. The method of claim 19, wherein the low-temperature plasma treatment process is a plasma treatment process using a radio frequency (RF) power.

25. The method of claim 24, wherein the RF power of 0.1 to 1.0 kW is applied.

26. The method of claim 19, wherein the low-temperature plasma treatment process is performed by repeatedly performing a plasma treatment operation and a purge operation a preset number of times.

\* \* \* \* \*